United States Patent
Dayringer et al.

(10) Patent No.: US 9,209,165 B2
(45) Date of Patent: Dec. 8, 2015

(54) TECHNIQUE FOR CONTROLLING POSITIONS OF STACKED DIES

(71) Applicant: Oracle International Corporation, Redwood City, CA (US)

(72) Inventors: Michael H. S. Dayringer, Union City, CA (US); R. David Hopkins, Foster City, CA (US); Alex Chow, Palo Alto, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 0 days.

(21) Appl. No.: 14/059,302

(22) Filed: Oct. 21, 2013

(65) Prior Publication Data

US 2015/0108615 A1    Apr. 23, 2015

(51) Int. Cl.
*H01L 25/065* (2006.01)
*H01L 25/00* (2006.01)
(Continued)

(52) U.S. Cl.
CPC .............. *H01L 25/50* (2013.01); *H01L 23/544* (2013.01); *H01L 24/16* (2013.01); *H01L 24/17* (2013.01); *H01L 24/72* (2013.01); *H01L 24/75* (2013.01); *H01L 24/81* (2013.01); *H01L 25/0652* (2013.01); *H01L 25/0657* (2013.01); *H01L 24/13* (2013.01); *H01L 24/29* (2013.01); *H01L 24/32* (2013.01); *H01L 2223/54426* (2013.01); *H01L 2224/0401* (2013.01); *H01L 2224/0557* (2013.01); *H01L 2224/05555* (2013.01); *H01L 2224/10135* (2013.01); *H01L 2224/10165* (2013.01); *H01L 2224/131* (2013.01); *H01L 2224/133* (2013.01); *H01L 2224/1329* (2013.01); *H01L 2224/1601* (2013.01); *H01L 2224/16105* (2013.01); *H01L 2224/16135* (2013.01); *H01L 2224/16151* (2013.01);

(Continued)

(58) Field of Classification Search
CPC ............... H01L 25/0652; H01L 25/18; H01L 2225/06503; H01L 2225/06555; H01L 2225/06562; H01L 2225/06568
USPC .................... 257/678, 723, 685, 680
See application file for complete search history.

(56) References Cited

U.S. PATENT DOCUMENTS

| | | |
|---|---|---|
| 8,373,280 B2 | 2/2013 | Harada et al. |
| 8,476,749 B2 | 7/2013 | Drost et al. |
| 2012/0049376 A1* | 3/2012 | Harada et al. ............... 257/773 |

OTHER PUBLICATIONS

Dayringer, Michael et al., "Method for Controlling Z-Position of Stacked Silicon Dice" Oracle Proprietary Information OL#2012-0286, (2012).

*Primary Examiner* — Daniel Whalen
*Assistant Examiner* — Aneta Cieslewicz
(74) *Attorney, Agent, or Firm* — Park, Vaughan, Fleming & Dowler LLP; Steven E. Stupp

(57) ABSTRACT

An assembly component and a technique for assembling a chip package using the assembly component are described. This chip package includes a set of semiconductor dies that are arranged in a stack in a vertical direction, which are offset from each other in a horizontal direction to define a stepped terrace at one side of the vertical stack. Moreover, the chip package may be assembled using the assembly component. In particular, the assembly component may include a pair of stepped terraces that approximately mirror the stepped terrace of the chip package and which provide vertical position references for an assembly tool that positions the set of semiconductor dies in the vertical stack during assembly of the chip package.

20 Claims, 7 Drawing Sheets

(51) Int. Cl.
*H01L 23/544* (2006.01)
*H01L 23/00* (2006.01)

(52) U.S. Cl.
CPC .......... *H01L 2224/1703* (2013.01); *H01L 2224/2919* (2013.01); *H01L 2224/29193* (2013.01); *H01L 2224/32145* (2013.01); *H01L 2224/73103* (2013.01); *H01L 2224/73203* (2013.01); *H01L 2224/73257* (2013.01); *H01L 2224/81007* (2013.01); *H01L 2224/819* (2013.01); *H01L 2224/8185* (2013.01); *H01L 2224/81129* (2013.01); *H01L 2224/81141* (2013.01); *H01L 2224/81815* (2013.01); *H01L 2224/81898* (2013.01); *H01L 2224/8313* (2013.01); *H01L 2224/8385* (2013.01); *H01L 2224/83132* (2013.01); *H01L 2224/83136* (2013.01); *H01L 2224/83193* (2013.01); *H01L 2224/92143* (2013.01); *H01L 2225/06517* (2013.01); *H01L 2225/06531* (2013.01); *H01L 2225/06551* (2013.01); *H01L 2225/06555* (2013.01); *H01L 2225/06562* (2013.01); *H01L 2225/06589* (2013.01); *H01L 2924/10253* (2013.01); *H01L 2924/1431* (2013.01); *H01L 2924/1434* (2013.01); *H01L 2924/1436* (2013.01); *H01L 2924/37001* (2013.01)

TECHNIQUE FOR CONTROLLING POSITIONS OF STACKED DIES

BACKGROUND

1. Field

The present disclosure generally relates to the process of manufacturing a semiconductor chip package. More specifically, the present disclosure relates to an assembly component and an associated technique for assembling the chip package, which includes a group of chips offset from each other in a vertical stack to define a stepped terrace.

2. Related Art

Chip packages that include stacked semiconductor chips or dies can provide significantly higher performance in comparison to conventional individually packaged chips that are connected to a printed circuit board. These chip packages also provide certain advantages, such as the ability: to use different processes on different chips in the stack, to combine higher density logic and memory, and to transfer data using less power. For example, a stack of chips that implements a dynamic random access memory (DRAM) can use a high-metal-layer-count, high-performance logic process in a base chip to implement input/output (I/O) and controller functions, and a set of lower metal-layer-count, DRAM-specialized processed chips can be used for the rest of the stack. In this way the combined set of chips may have better performance and lower cost than: a single chip that includes I/O and controller functions manufactured using the DRAM process; a single chip that includes memory circuits manufactured using a logic process; and/or attempting to use a single process to make both logic and memory physical structures.

However, it can be difficult to assemble chip packages that include stacked semiconductor chips. In particular, existing assembly techniques may be time-consuming and may have low yields (which may increase the cost of the chip package). For example, in many existing assembly techniques the total vertical position error over the stack of semiconductor chips is the sum of the vertical position errors associated with each of the semiconductor chips. Consequently, the total vertical position error for stacks that include multiple semiconductor chips can become prohibitively large. This may result in tight manufacturing tolerances to reduce the individual vertical position errors (which can increase the cost of the semiconductor dies) and/or may constrain the number of semiconductor chips that can be assembled in a stack (which may limit performance).

Hence, what is needed is a technique for assembling a stack of chips without the problems described above.

SUMMARY

One embodiment of the present disclosure provides an assembly component that includes a pair of stepped terraces having a vertical stack of steps in which a given step is offset from an adjacent step in a plane of the steps to define the pair of stepped terraces. The steps in the pair of stepped terraces provide vertical reference positions that constrain vertical positions of an assembly tool during assembly of a ramp-stack chip package in which a set of semiconductor dies is arranged in a vertical stack. Moreover, a given semiconductor die in the ramp-stack chip package is offset from an adjacent semiconductor die in a plane of the set of semiconductor dies to define a stepped terrace. During the assembly of the ramp-stack chip package, while the pair of stepped terraces constrains a vertical position of the assembly tool, the assembly tool is mechanically coupled to a top surface of the given semiconductor die and a bottom surface of the given semiconductor die is mechanically coupled to the ramp-stack chip package.

Note that the set of semiconductor dies may include N semiconductor dies (such as more than 40 semiconductor dies) and position errors of the set of semiconductor dies in the ramp-stack chip package in a vertical direction along the vertical stack may be independent of vertical position in the ramp-stack chip package. For example, the position errors may each be less than ±20 µm. Additionally, the assembly component may facilitate assembly of the ramp-stack chip package with an accumulated position error over the set of semiconductor dies in the vertical direction along the vertical stack that is less than a sum of position errors associated with the set of semiconductor dies and adhesive layers between the semiconductor dies. The accumulated position error may be associated with: thickness variation of the semiconductor dies and/or thickness variation of the adhesive layers.

Furthermore, the given semiconductor die may include solder pads and bumps on the top surface, and the assembly tool may pick up the given semiconductor die in a region of the top surface other than where the solder pads and the bumps are located.

In some embodiments, the stepped terrace is a mirror image of the pair of stepped terraces.

Note that the given semiconductor die may have a nominal thickness, and a vertical displacement of the given step in the stepped terrace may be larger than the nominal thickness.

Moreover, the assembly component may facilitate rigid mechanical coupling of a ramp component to the ramp-stack chip package. This ramp component may be positioned on one side of the vertical stack and may be approximately parallel to a direction along the stepped terrace, which is between a horizontal direction in the plane of the set of semiconductor dies and the vertical direction along the vertical stack.

Another embodiment provides a method for assembling the ramp-stack chip package. During this method, an adhesive is applied to a top surface of a semiconductor die in the ramp-stack chip package in which the set of semiconductor dies is arranged in the vertical stack, where the given semiconductor die in the vertical stack is offset from the adjacent semiconductor die in a plane of the set of semiconductor dies to define the stepped terrace. Then, using the assembly tool, a second semiconductor die is picked up on a top surface of the second semiconductor die. Next, a bottom surface of the second semiconductor die is placed on the adhesive on the top surface of the semiconductor die while the vertical position of the assembly tool is constrained by a given step in the assembly component having the pair of stepped terraces that are arranged on either side of the ramp-stack chip package, where steps in the pair of stepped terraces provide vertical reference positions.

Note that the applying, picking and placing operations are repeated for additional semiconductor dies in the set of semiconductor dies to assemble the ramp-stack chip package, and vertical positions of the assembly tool are constrained by the steps in the pair of stepped terraces when the ramp-stack chip package is assembled.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of an assembly component and a method for assembling a chip package using the assembly component are described. This chip package includes a set of semiconductor dies that are arranged in a stack in a vertical direction, which are offset from each other in a horizontal direction to define a stepped terrace at one side of the vertical stack. Moreover, the chip package includes a ramp component positioned on one side of the vertical stack, which is approximately parallel to a direction along the stepped terrace. This chip package may be assembled using the assembly component. In particular, the assembly component may include a pair of stepped terraces that approximately mirror the stepped terrace of the chip package and which provide vertical position references for an assembly tool that positions the set of semiconductor dies in the vertical stack during assembly of the chip package.

By facilitating assembly of the chip package, the assembly component and the assembly techniques may enable low-cost, high-throughput manufacturing of a high-performance chip package (such as a chip package with high-bandwidth interconnects). In particular, these embodiments may facilitate reduced mechanical errors during assembly of the chip package, and a chip package that is more tolerant of mechanical variations in sizes and positions of components in the chip package. For example, using these embodiments the set of semiconductor dies may be assembled in the chip package with a total vertical position error over the stack that is less than the vertical position errors (which are sometimes referred to as 'vertical errors') associated with the semiconductor dies and the adhesive layers between the semiconductor dies. This may be achieved by independently referencing the assembly tool that positions each semiconductor die in the chip package to the assembly component (instead of mechanically referencing a given semiconductor die in the stack to an immediately preceding semiconductor die during assembly). Thus, the assembly component and the associated assembly technique may prevent the individual vertical position errors from being compounded.

Figure 1:
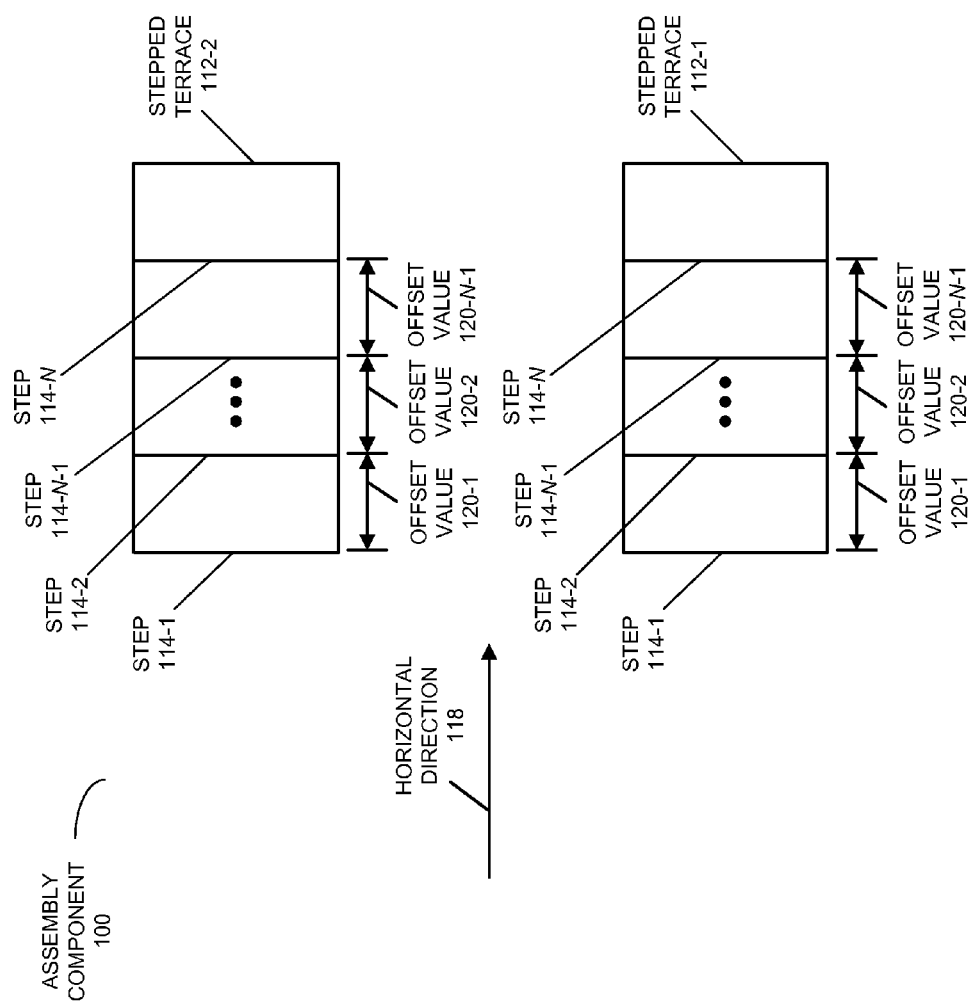
FIG. 1 is a block diagram illustrating a top view of an assembly component for assembling a chip package in accordance with an embodiment of the present disclosure.
Figure 2:
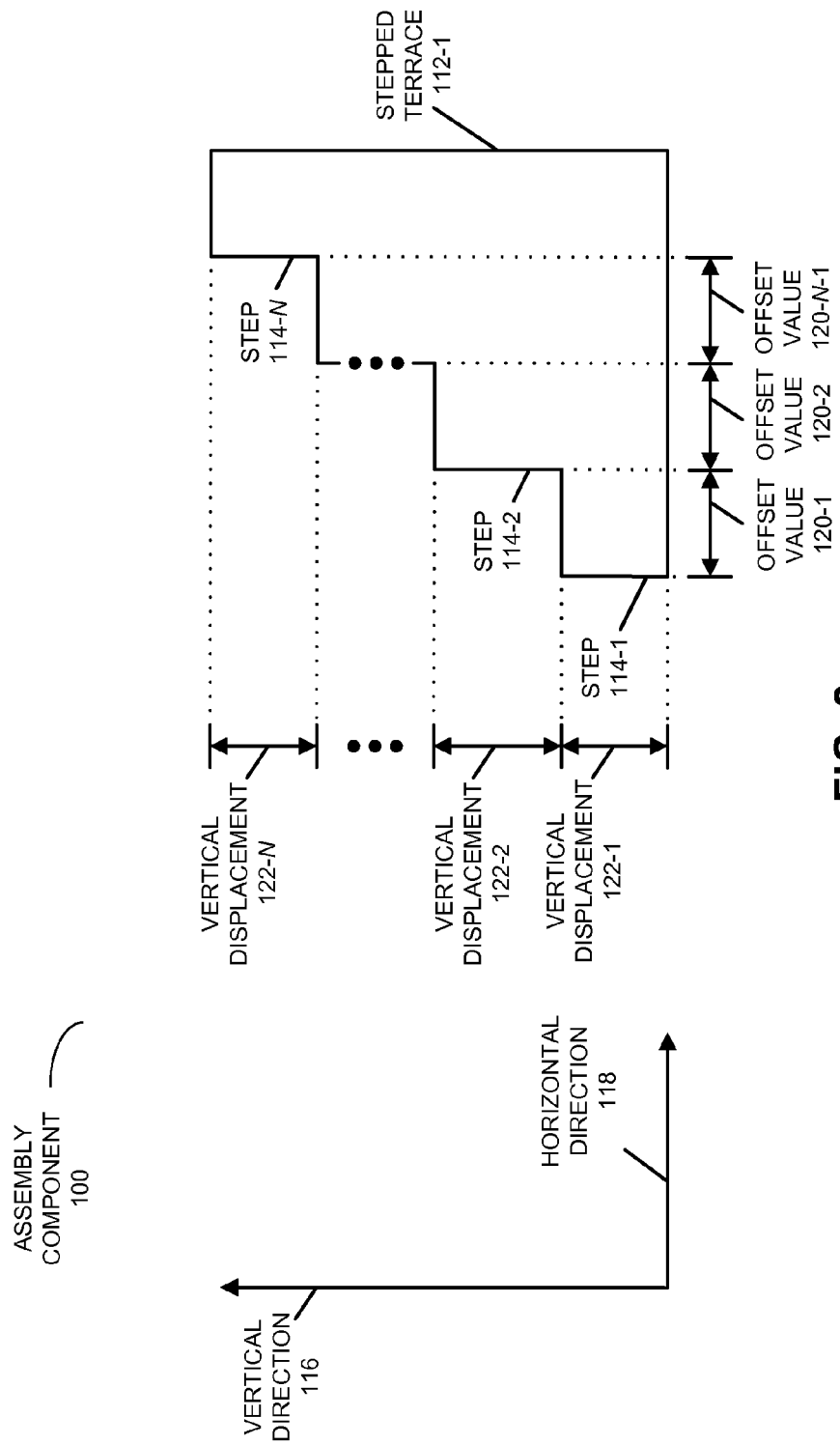
FIG. 2 is a block diagram illustrating a side view of the assembly component of FIG. 1 in accordance with an embodiment of the present disclosure.

We now describe embodiments of the assembly component and the chip package. FIG. 1 presents a block diagram illustrating a top view of an assembly component 100 (which is sometimes referred to as a 'manufacturing fixture') that can be used to position and secure semiconductor dies (or chips) during assembly of a chip package (such as chip package 500 in FIGS. 5 and 6, which is sometimes referred to as a 'ramp-stack chip package'). This assembly component includes a pair of stepped terraces 112, which may be fabricated using a grinding mill. These stepped terraces may be on either side of a ramp-stack chip package that is being assembled. Moreover, a given stepped terrace (such as stepped terrace 112-1) includes a sequence of steps 114 in a vertical direction 116 (FIG. 2). Note that each step after step 114-1 is offset in a horizontal direction 118 by an associated one of offset values 120 from an immediately preceding step in the sequence of steps 114. Furthermore, offset values 120 may each have approximately a constant value for the sequence of steps 114 or may vary over the sequence of steps 114 (i.e., the offset values for different steps 114 in the pair of stepped terraces 112 may be different).

Additionally, as shown in FIG. 2, which presents a block diagram illustrating a side view of assembly component 100, vertical displacements 122 associated with the sequence of steps 114 (other than those for step 114-1 or step 114-N) may each have approximately a constant value or may vary over the sequence of steps 114 (i.e., the vertical displacements for different steps 114 in stepped terraces 112 may be different).

Figure 3:
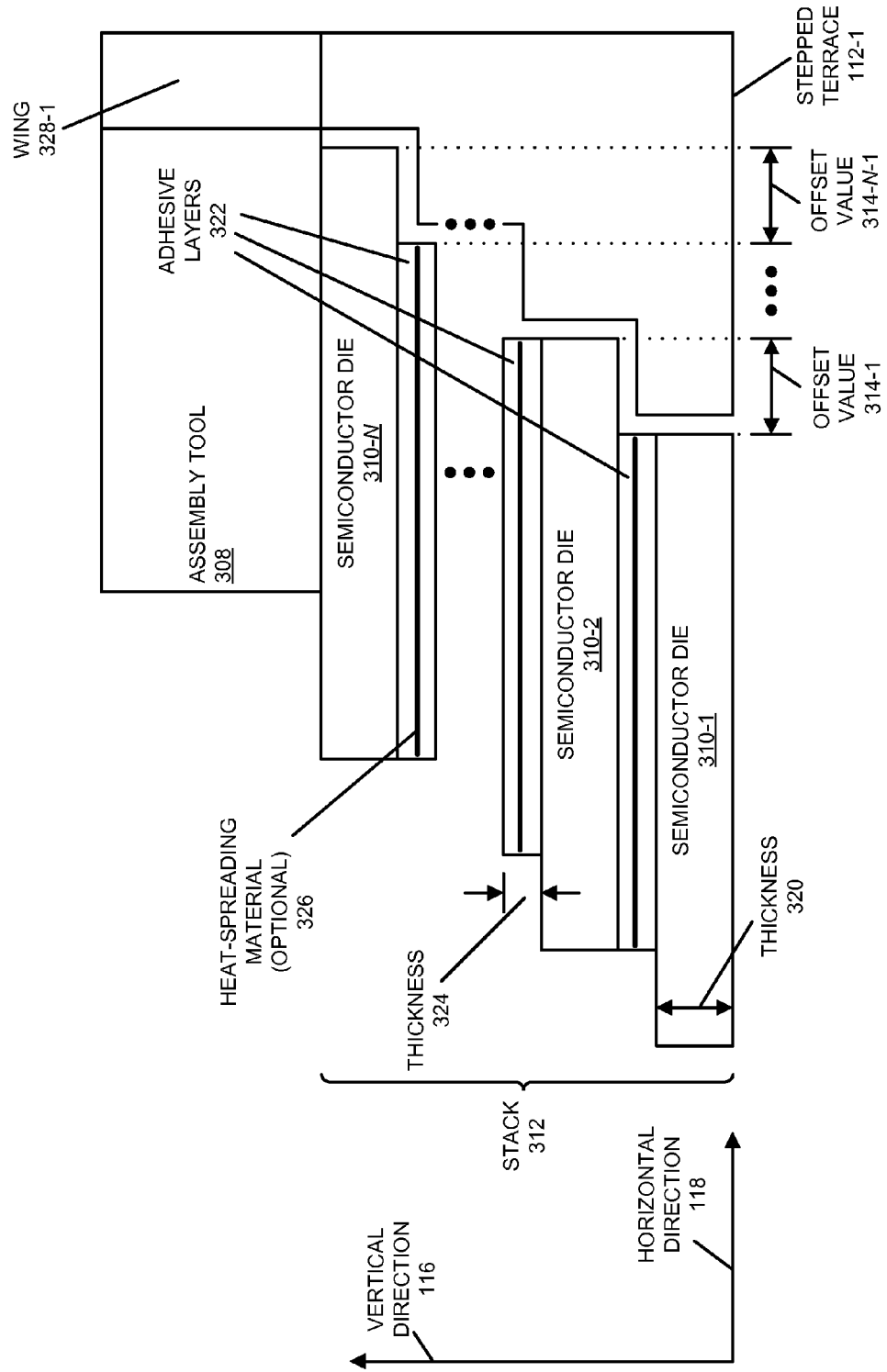
FIG. 3 is a block diagram illustrating a side view of assembly of the chip package using the assembly component of FIGS. 1 and 2 in accordance with an embodiment of the present disclosure.

As shown in FIG. 3, which presents a block diagram illustrating a side view of assembly of the chip package using this assembly component, the pair of stepped terraces may be configured to mate with an assembly tool 308 that positions a set of semiconductor dies 310 (e.g., 50 semiconductor dies 310) such that the set of semiconductor dies 310 are arranged in a stack 312 in vertical direction 116. Note that vertical direction 116 is substantially perpendicular to semiconductor die 310-1 in stack 312 (and, thus, with horizontal direction 118). Additionally, each semiconductor die, after semiconductor die 310-1, may be offset in horizontal direction 118 by an associated one of offset values 314 from an immediately preceding semiconductor die in stack 312, thereby defining the stepped terrace at one side of stack 312. These offset values may have approximately a constant value for the set of semiconductor dies 310 or may vary over the set of semiconductor dies 310 (i.e., the offset values for different steps in stepped terrace 112-1 may be different).

During assembly of the chip package, while the pair of stepped terraces constrains a vertical position of assembly tool 308 that is mated with a given pair of steps 114 (FIGS. 1 and 2), assembly tool 308 is mechanically coupled to a top surface of the given semiconductor die (for example, the given semiconductor die may be held in place using a vacuum) and a bottom surface of the given semiconductor die is mechanically coupled to the chip package (for example, using an adhesive, such as a glue). Unlike existing assembly techniques in which the bottom surface of the given semiconductor die is used as a reference, by using the top surface as a reference this assembly technique may be less sensitive to variations in the thicknesses of semiconductor dies 310 (such as variations in thickness 320 associated with uneven thinning) that can result in position errors in stack 312. In particular, a given pair of steps in the pair of stepped terraces and the top surface ensure that the bottom surface of the given semiconductor die is in the correct position.

Figure 4:
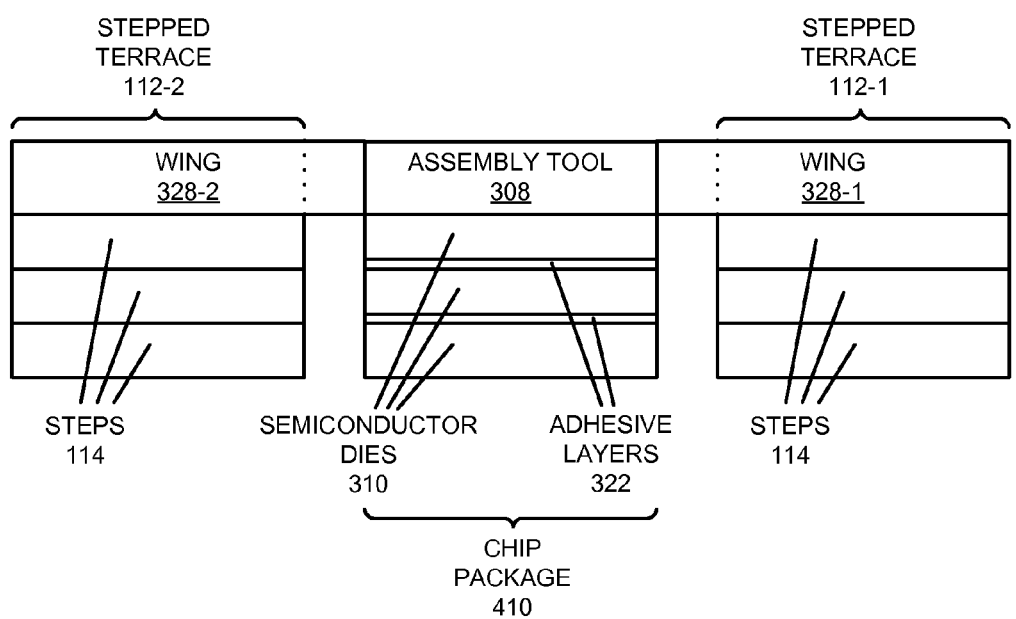
FIG. 4 is a drawing illustrating a front view of the assembly of the chip package using the assembly component of FIGS. 1 and 2 in accordance with an embodiment of the present disclosure.

Note that the given semiconductor die may include solder pads and bumps on the top surface. Consequently, it may not be possible to assemble the chip package by placing semiconductor dies 310 face down on stack 312 (even though this arrangement would also be less sensitive to thickness variations of semiconductor dies 310) because this could damage the solder pads and bumps. Instead, assembly tool 308 may pick up the given semiconductor die in a region of the top surface other than where the solder pads and the bumps are located. In addition, assembly tool 308 may ensure that the given semiconductor die does not touch the pair of stepped terraces. In particular, assembly tool 308 may overhang semiconductor dies 310 on one or more edges. These so-called 'wings' (such as wing 328-1) may be rigid structures that can be placed against the steps in the pair of stepped terraces. These steps act as rigid stops that control the position of assembly tool 308 and, thus, the top surface of the given semiconductor die. This is illustrated in FIG. 4, which presents a drawing illustrating a front view of the assembly process for chip package 410. In FIG. 4, note that there may be intentional gaps between semiconductor dies 310 that are filled with adhesive layers 322 (such as a glue), and which may be able to tolerate variation in the thickness of semiconductor dies 310 so that it does not affect the final placement accuracy or position error. However, this assembly technique may be sensitive to a thickness of semiconductor die 310-1 in stack 312 because this semiconductor die may rest on a fixture that holds the pair of stepped terraces. One solution for this challenge is to use a 'dummy' die for semiconductor die 310-1, which would allow the first position in stack 312 to be sacrificed without wasting real semiconductor dies 310 in stack 312. In this case, the total height of stack 312 may be adjusted so that stack 312 includes the same number of real semiconductor dies 310.

As additional semiconductor dies 310 are placed, assembly tool 308 may move up and back along each of the pair of stepped terraces, each time resting on a new set of co-planar steps with the offset in the horizontal direction. Before placing a semiconductor die in stack 312, an adhesive layer may be deposited on the top surface of the preceding semiconductor die in stack 312. Note that, in contrast with existing assembly techniques, these adhesive layers may only need to be set once when assembling the chip package.

Figure 5:
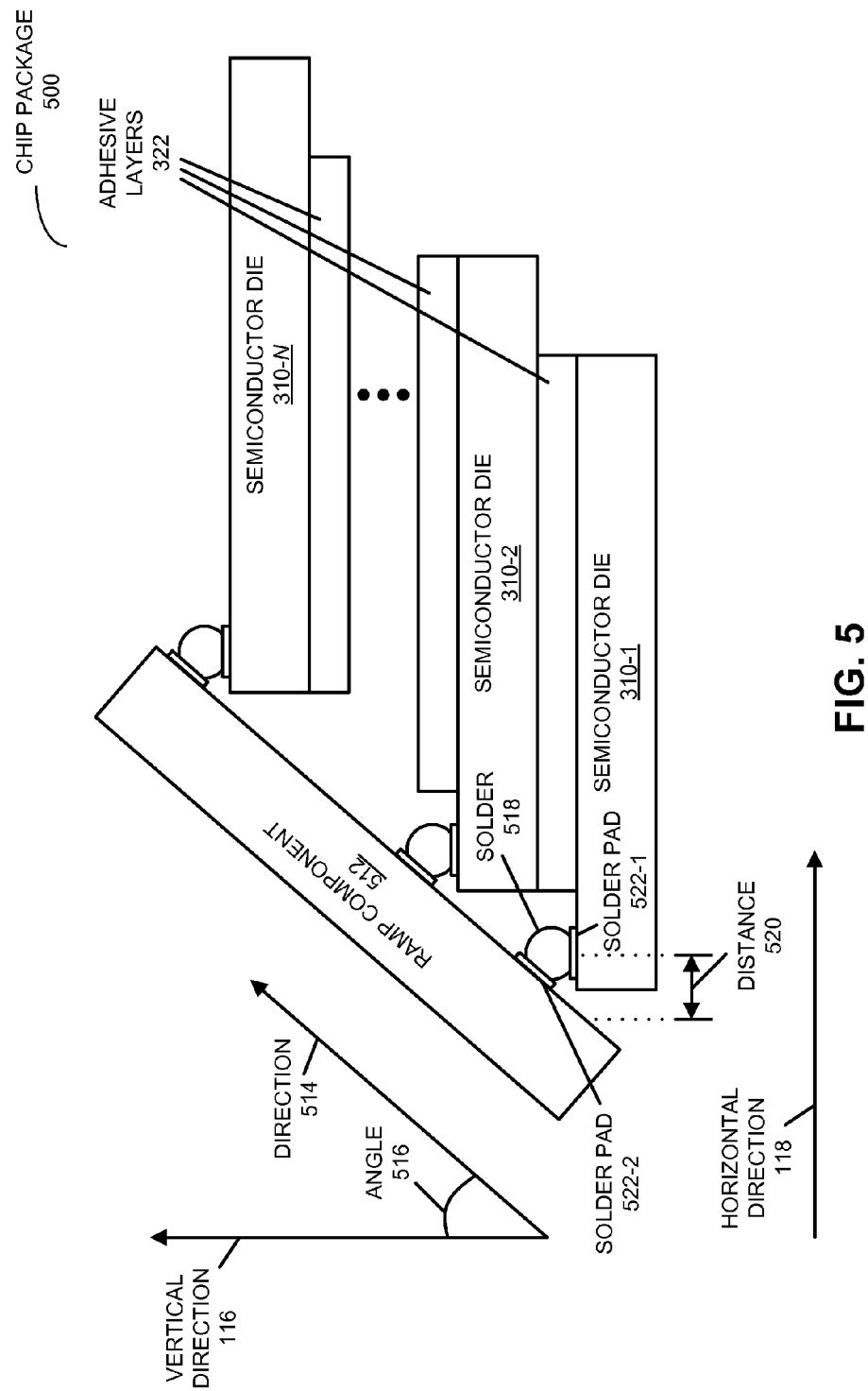
FIG. 5 is a block diagram illustrating a side view of the assembled chip package in accordance with an embodiment of the present disclosure.

As shown in FIG. 5, which presents a block diagram illustrating a side view of assembled chip package 500, assembly component 100 (FIGS. 1 and 2) may facilitate assembly of chip package 500 in which: high-bandwidth ramp component 512 is rigidly mechanically and electrically coupled to semiconductor dies 310, thereby facilitating communication between semiconductor dies 310 and supplying power to semiconductor dies 310; ramp component 512 is positioned on one side of stack 312 (FIG. 3); and ramp component 512 is approximately parallel to a direction 514 (at angle 516) along stepped terrace 112-1 (FIG. 3), which is between horizontal direction 118 and vertical direction 116.

Referring back to FIG. 3, to facilitate the assembly the pair of stepped terraces may approximately be a mirror image of stepped terrace 112-1. Furthermore, a given semiconductor die in the set of semiconductor dies 310 may have a nominal thickness 320, and a vertical displacement of a given step in a sequence of steps 114 (FIGS. 1 and 2) may be larger than nominal thickness 320 (or it may be larger than a maximum thickness of any of semiconductor dies 310). However, note that in some embodiments the thickness of at least some of semiconductor dies 310 in stack 312 may be different (for example, the thicknesses may vary over stack 312).

In an exemplary embodiment, vertical displacements 122 (FIG. 2) may each be 160 µm versus nominal thickness 320 of 150±5 µm. (However, in other embodiments thickness 320 may be between 30 and 250 µm, such as 90 µm.) This additional vertical displacement relative to thickness 320 may allow the adhesive in adhesive layers 322 to spread during assembly. Note that for nominal thickness 320 of 150 µm, angle 516 (FIG. 5) may be between 15 and 20°. In general, nominal thickness 320 depends, in part, on the number of semiconductor dies 310 in stack 312. Furthermore, note that a nominal thickness 324 of adhesive layers 322 may be 10 µm. However, in other embodiments the thickness of adhesive layers 322 may vary along vertical direction 116 in stack 312. (Note that adhesive layers 322 may provide tolerance for vertical position errors in stack 312.)

Additionally, the offset value at a given step in the pair of stepped terraces 112 (FIGS. 1 and 2) may be the same as or larger than the associated offset value in stepped terrace 112-1. In general, offset values 120 (FIGS. 1 and 2) and offset values 314 may be determined based on direction 514 (or angle 516) in FIG. 5 and a nominal thickness of solder (such as solder ball 518 in FIG. 5) used to rigidly mechanically couple ramp component 512 (FIG. 5) to set of semiconductor dies 310. Note that the thickness of the solder may be approximately constant over the stack or may vary over the stack (i.e., along vertical direction 116).

Because assembly component 100 (FIGS. 1 and 2) reduces the sensitivity of the chip package to variations of thicknesses of semiconductor dies 310 (such as thickness 320), assembly component 100 (FIGS. 1 and 2) may facilitate assembly of the set of semiconductor dies 310 with an accumulated position error over the set of semiconductor dies 310 in vertical direction 116 (i.e., an accumulated position error in the vertical positions of semiconductor dies over the stack 312) that is less than a sum of vertical errors associated with the set of semiconductor dies 310 and adhesive layers 322 (such as an epoxy or glue that cures in 10 s at 150 C) between the semiconductor dies 310. For example, the accumulated vertical position error may be associated with: thickness variation of the semiconductor dies 310, thickness variation of adhesive layers 322, and/or thickness variation of an optional heat-spreading material 326 (such as pressed graphite fibers) in at least some of adhesive layers 322. In some embodiments, the accumulated vertical position error may be a couple of microns (such as less than 1 µm), and may be as small as 0 µm. In an exemplary embodiment, the vertical position error of a given semiconductor die is ±10 to 20 µm. In some embodiments, this may be accomplished by using the assembly tool (which may be coupled to a pick-and-place machine) to assemble chip package 500 (FIG. 5) in conjunction with optical alignment markers (such as fiducial markers) on assembly component 100 in FIGS. 1 and 2 and/or semiconductor dies 310. Alternatively or additionally, in some embodiments assembly component 100 in FIGS. 1 and 2 includes mechanical stops, such as mechanical stops fabricated using polyimide, and the assembly tool may be pushed up against these mechanical stops during assembly of chip package 500 in FIG. 5, thereby facilitating desired tolerances in horizontal direction 118 and/or vertical direction 116.

In some embodiments, the position errors are further reduced by leveling the assembly tool relative to assembly component 100 (FIGS. 1 and 2) using a local positioning system that provides vertical and/or horizontal references. Additionally, in some embodiments of FIG. 1 there is a third stepped terrace that is in the same plane as the pair of stepped terraces 112, but which is offset horizontally from the pair of stepped terraces 112. In conjunction with the pair of stepped terraces 112, this third stepped terrace may provide a three-point plane on which the assembly tool rests and which the assembly tool can use as a reference when self-leveling, thereby improving the position accuracy of semiconductor dies 310 when ramp-stack chip package 500 in FIG. 5 is assembled.

Referring back to FIG. 5, note that in order to accommodate mechanical alignment errors in vertical direction 116, the height and pitch of the solder bumps or pads (such as solder pad 522-1 and/or solder pad 522-2) and/or solder ball 518 may vary between at least some of semiconductor dies 310 along vertical direction 116. For example, distance 520 (i.e., the position of solder pad 522-1 relative to a center of a saw lane for semiconductor die 510-1) may be 60 μm and solder pads 522 may each have an 80 μm width. Furthermore, the solder balls (such as solder ball 518) may have a diameter of 120 μm prior to reflowing or melting, and an approximate thickness between 40 and 60 μm after melting. In some embodiments, two or more rows of solder balls may rigidly couple ramp component 512 to a given semiconductor die.

Figure 6:
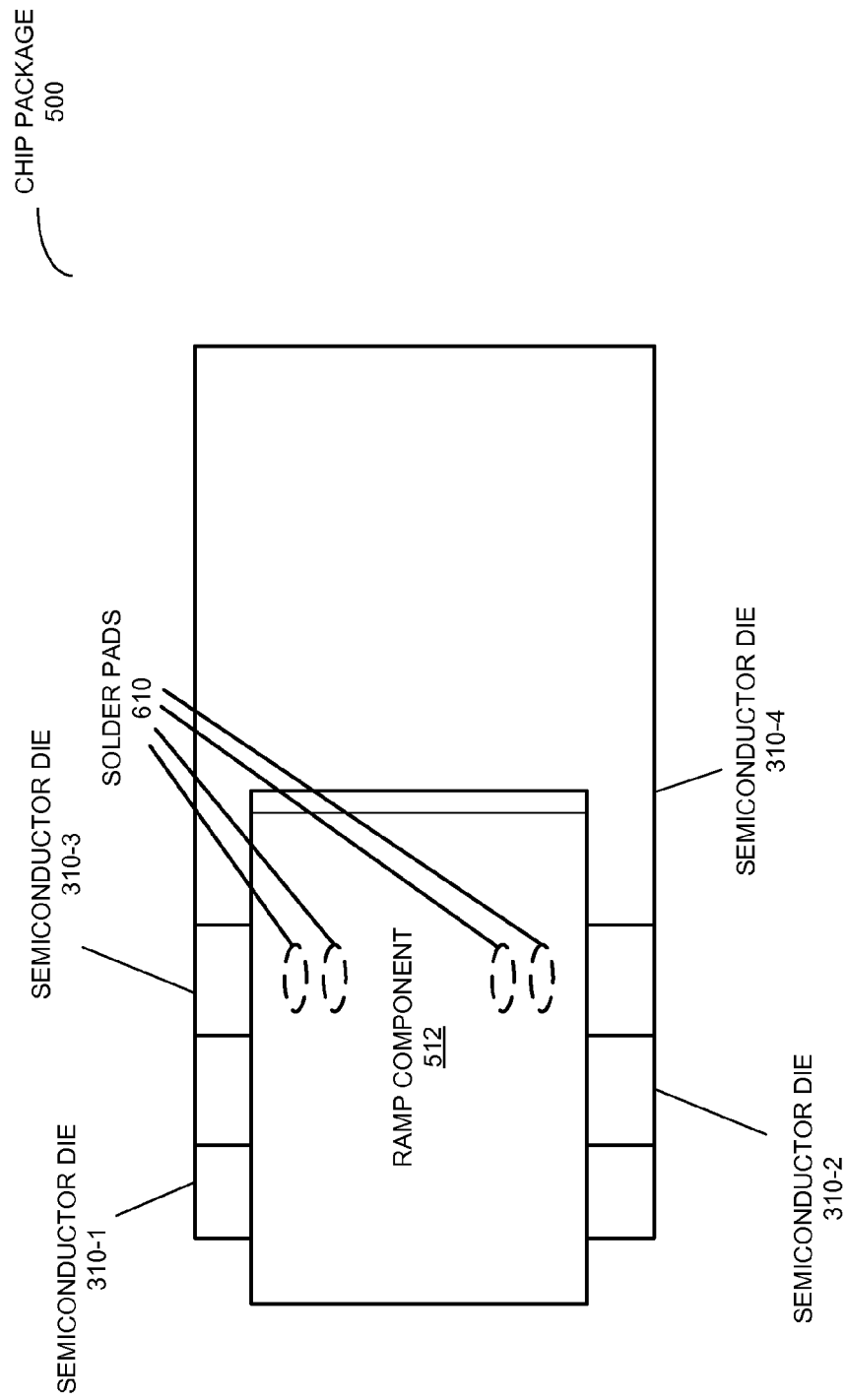
FIG. 6 is a block diagram illustrating a top view of the assembled chip package in accordance with an embodiment of the present disclosure.

FIG. 6 presents a block diagram illustrating a top view of assembled chip package 500 in which stack 312 (FIG. 3) includes four semiconductor dies 310. This view of chip package 500 illustrates that in some embodiments solder pads 610 may have non-rectangular shapes. For example, solder pads 610 may have oblong shapes, such as those that are 80 μm wide and 120 μm long. These solder-pad shapes on semiconductor dies 310 and/or ramp component 512 may tolerate some horizontal and/or vertical position errors.

In some embodiments, the solder pads can be moved to an edge of ramp component 512. This may facilitate a perpendicular orientation (i.e., angle 516 in FIG. 5 may be 0°). This configuration may facilitate a memory module in which contacts or pads associated with input/output (I/O) signal lines and power lines are at the edge of the ramp component (instead of down the 'spine'). In this way, a number of diffusion layers in the ramp component may be reduced. For example, there may be 60 contacts or pads along an edge of ramp component 512 in this memory module.

By allowing the stacking process during assembly of chip package 500 to be referenced to assembly component 100 in FIGS. 1 and 2 (as opposed to the immediately preceding semiconductor die in stack 312 in FIG. 3), this assembly component can effectively reduce horizontal and/or vertical position errors associated with mechanical variations in the sizes and thicknesses of components in chip package 500. For example, vertical position errors of semiconductor dies 310 may each be less than ±20 μm. Thus, assembly component 100 in FIGS. 1 and 2 may facilitate highly accurate and high-yield assembly of chip package 500. Furthermore, because this assembly component also facilitates the use of high-volume and low-cost manufacturing techniques (such as a pick-and-place machine), it can greatly reduce the cost of chip package 500.

In addition, the ability to assemble low-cost, high-yield chip packages may facilitate high-performance devices. For example, in some embodiments a ramp-stack chip package (such as chip package 500) is included in a dual in-line memory module. For example, there may be up to 80 memory devices (such as dynamic random access memory or another type of memory-storage device) in the ramp-stack chip package. If needed, 'bad' or faulty memory devices can be disabled. Thus, 72 memory devices (out of 80) may be used. Furthermore, this configuration may expose the full bandwidth of the memory devices in the memory module, such that there is little or no latency delay in accessing any of the memory devices.

Alternatively, the dual in-line memory module may include multiple fields that each can include a ramp-stack chip package. For example, there may be four ramp-stack chip packages (each of which include nine memory devices) in a dual in-line memory module.

In some embodiments, one or more of these dual in-line memory modules (which can include one or more ramp-stack chip packages) may be coupled to a processor. For example, the processor may be coupled to the one or more dual in-line memory modules using capacitive proximity communication (PxC) of capacitively coupled signals. In turn, the processor may be mounted on a substrate using C4 solder balls.

In some embodiments, the assembly tool has tilt compliance and the ability to move vertically, while not allowing motion in the plane of the semiconductor dies. Alternatively, a ball joint (such as a hard sphere on the end of a rod that is seated in a cup) may be used. This ball joint may provide a joint that allows for some rotation about all three rotation axes, but does not allow translation. For the assembly tool, the rod may be the mounting shaft that attaches to a pick-and-place machine, and the cup may be placed inside the pick surface so that the pivot point is as close as possible to the semiconductor die. This arrangement may allow the surface of the pick-and-place machine to tilt to meet the assembly tool, but it may not support translation. Note that the ball joint may not have any compliance in the vertical direction. However, the ball joint may allow rotation along all three rotational axes, so that the assembly tool can rotate about the mounting shaft. Yet another possibility is a spherical bearing, which is similar to the ball joint, except that instead of trapping a ball inside a small cup on the surface of the pick-and-place machine, the entire surface of the pick-and-place machine may be inside a larger spherical surface. This spherical surface may be included inside an even larger spherical surface, which may allow the two spherical surfaces to rotate relative to each other. As with the ball joint, the spherical bearing allows for the desired rotation along all three rotational axes but not the undesired translation of the assembly tool.

Figure 7:
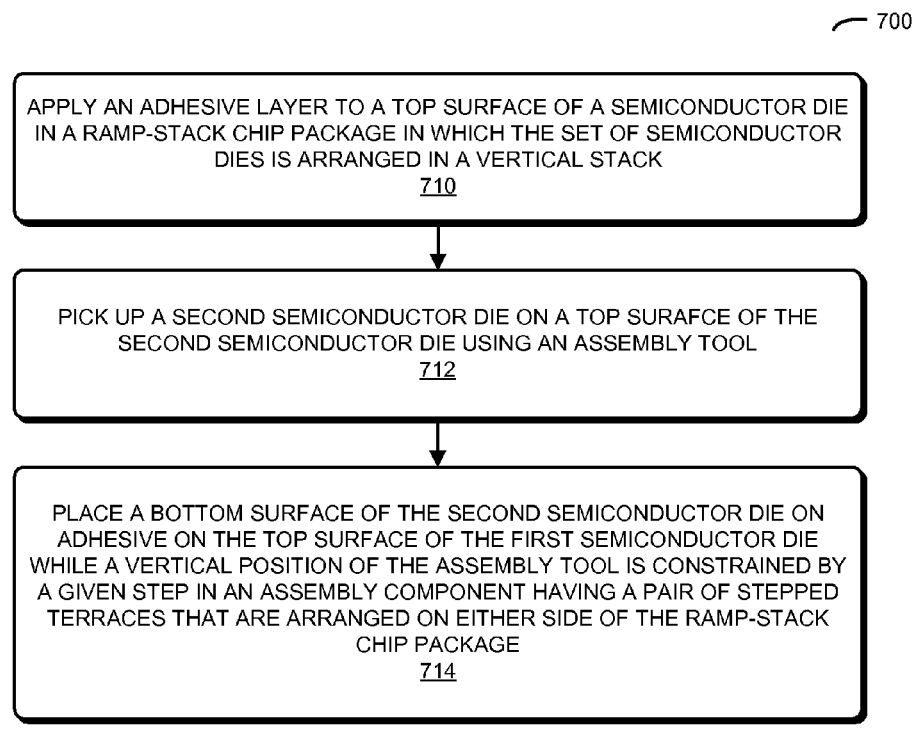
FIG. 7 is a flow diagram illustrating a method for assembling the chip package using the assembly component of FIGS. 1 and 2 in accordance with an embodiment of the present disclosure.

We now describe embodiments of the assembly techniques. FIG. 7 presents a flow diagram illustrating a method 700 for assembling a chip package using assembly component 100 (FIGS. 1 and 2). During this method, an adhesive is applied to a top surface of a semiconductor die in a ramp-stack chip package in which the set of semiconductor dies is arranged in a vertical stack (operation 710), where the given semiconductor die in the vertical stack is offset from an adjacent semiconductor die in a plane of a set of semiconductor dies to define a stepped terrace. Then, using an assembly tool, a second semiconductor die is picked up on a top surface of the second semiconductor die (operation 712). Next, a bottom surface of the second semiconductor die is placed on the adhesive on the top surface of the semiconductor die while a vertical position of an assembly tool is constrained by a given step in the assembly component having a pair of stepped terraces that are arranged on either side of the ramp-stack chip package (operation 714), where steps in the pair of stepped terraces provide vertical reference positions.

In some embodiments of method 700, there may be additional or fewer operations. For example, the stack may be assembled in pieces that include a subset of the semiconductor dies, which are subsequently combined into a full stack. Moreover, a ramp component may be rigidly mechanically coupled to the semiconductor die and the second semiconductor die, where the ramp component is positioned on one side of the vertical stack, and where the ramp component is approximately parallel to a direction along the stepped terrace, which is between a horizontal direction and a vertical direction.

Furthermore, rigidly mechanically coupling the ramp component to the semiconductor die and the second semiconductor die may involve melting solder on: the ramp component and/or the semiconductor die and the second semiconductor die. When reflowing the solder, the ramp component may be placed on the stack or vice versa. This may allow the weight of the ramp component (or the stack of semiconductor dies) to help overcome the surface tension of the solder.

Note that, when rigidly mechanically coupling the ramp component to the semiconductor die and the second semiconductor die, a compressive force may be applied in the vertical direction. This may ensure that the assembled chip package has a desired height. In some embodiments, a compressive force is applied along a normal to the ramp component. Either of these compressive forces may improve heat transfer within the stack, for example, by filling or reducing gaps between components in the chip package.

Additionally, the order of the operations in FIG. 7 may be changed, and/or two or more operations may be combined into a single operation.

Note that assembly component 100 (FIGS. 1 and 2) and chip package 500 (FIGS. 5 and 6) may include fewer components or additional components. For example, there may be breaks defined in a stack of semiconductor dies in a ramp-stack chip package, such as by not including solder pads for one or more of the semiconductor dies on the ramp component. Moreover, although these devices and systems are illustrated as having a number of discrete items, these embodiments are intended to be functional descriptions of the various features that may be present rather than structural schematics of the embodiments described herein. Consequently, in these embodiments, two or more components may be combined into a single component and/or a position of one or more components may be changed.

While the preceding embodiments use semiconductor dies (such as silicon) in the chip package, in other embodiments a different material than a semiconductor may be used as the substrate material in one or more of these chips. However, in embodiments in which silicon is used, semiconductor dies 310 (FIGS. 3-6) may be fabricated using standard silicon processing. These semiconductor dies may provide silicon area that supports logic and/or memory functionality.

Furthermore, in FIGS. 5 and 6 ramp component 512 may be a passive component, such as a plastic substrate with metal traces to electrically couple to semiconductor dies 310. For example, ramp component 512 may be fabricated using injection-molded plastic. Alternatively, ramp component 512 may be another semiconductor die with lithographically defined wires or signal lines. In embodiments where ramp component 512 includes a semiconductor die, active devices, such as limit amplifiers, may be included to reduce crosstalk between the signal lines. Additionally, crosstalk may be reduced in either an active or a passive ramp component 512 using differential signaling.

In some embodiments, ramp component 512 includes transistors and wires that shuttle data and power signals among semiconductor dies 310 via solder balls (such as solder ball 518). For example, ramp component 512 may include high-voltage signals. These signals may be stepped down for use on semiconductor dies 310 using: a step-down regulator (such as a capacitor-to-capacitor step-down regulator), as well as capacitor and/or inductor discrete components to couple to semiconductor dies 310.

Additionally, ramp component 512 may include a buffer or logic chip for memory, and/or I/O connectors to external device(s) and/or system(s). For example, the I/O connectors may include one or more: ball bonds, wire bonds, edge connectors and/or P×C connectors for coupling to external devices. In some embodiments, these I/O connectors may be on a back surface of ramp component 512, and ramp component 512 may include one or more through-silicon vias (TSVs) that couple the I/O connectors to solder pads, such as solder pad 522-2.

In some embodiments, ramp component 512 and semiconductor dies 310 in chip package 500 are mounted on an optional substrate (such as a printed circuit board or a semiconductor die). This optional substrate may include: ball bonds, wire bonds, edge connectors and/or P×C connectors for coupling to external devices. If these I/O connectors are on a back surface of the optional substrate, the optional substrate may include one or more TSVs.

While solder balls are used in the preceding embodiments as an illustration of the electrical and mechanical coupling of ramp component 512 and semiconductor dies 310, in other embodiments these components may be electrically and/or mechanically coupled using other techniques, such as: microsprings, microspheres (in a ball-in-pit configuration described below), and/or an anisotropic film (such as an anisotropic elastomer film, which is sometimes referred to as an 'anisotropic conductive film').

In embodiments where components in chip packages communicate with P×C of electromagnetically coupled signals (such as P×C between: ramp component 512 and semiconductor dies 310, ramp component 512 and an external device, ramp component 512 and optional substrate, optional substrate and semiconductor dies 310 and/or optional substrate and the external device), the P×C may include: communication of capacitively coupled signals (which is referred to as 'electrical proximity communication'), communication of optically coupled signals (which is referred to as 'optical proximity communication'), communication of electromagnetically coupled signals (which is referred to as 'electromagnetic proximity communication'), communication of inductively coupled signals, and/or communication of conductively coupled signals.

In general, the impedance of the resulting electrical contacts may be conductive and/or capacitive, i.e., may have a complex impedance that includes an in-phase component and/or an out-of-phase component. Regardless of the electrical contact mechanism (such as solder, micro-springs, an anisotropic layer, etc.), if the impedance associated with the contacts is conductive, conventional transmit and receive I/O circuits may be used in components in chip package 500. However, for contacts having a complex (and, possibly, variable) impedance, the transmit and receive I/O circuits may include one or more embodiments described in U.S. patent application Ser. No. 12/425,871, entitled "Receive Circuit for Connectors with Variable Complex Impedance," by Robert J. Drost et al., filed on Apr. 17, 2009, the contents of which are incorporated herein by reference.

Note that packaging techniques that allow some rework are more cost-effective when faced with lower semiconductor-die yields or high expense to test extensively before packaging and assembly. Therefore, in embodiments where the mechanical and/or electrical coupling between semiconductor dies 310 and ramp component 512 are remateable, the yield of chip package 500 may be increased by allowing rework (such as replacing a bad chip that is identified during assembly, testing or burn-in). In this regard, remateable mechanical or electrical coupling should be understood to be mechanical or electrical coupling that can be established and broken repeatedly (i.e., two or more times) without requiring rework or heating (such as with solder). In some embodiments, the remateable mechanical or electrical coupling involves male and female components designed to couple to each other (such as components that snap together).

While FIGS. 5 and 6 illustrate a particular configuration of chip package 500, a number of techniques and configurations may be used to implement mechanical alignment and assembly with or without using assembly component 100 (FIGS. 1 and 2). For example, semiconductor dies 310 and/or ramp component 512 may be positioned relative to each other using a ball-in-pit alignment technique (and, more generally, a positive-feature-in-negative-feature alignment technique). In particular, balls may be positioned into etch pits to relatively align components, such as semiconductor dies 310 in stack 312 (FIG. 3). Other examples of positive features include hemisphere-shaped bumps. However, any combination of mechanically locking positive and negative surface features on components in chip package 500 may be used to align and/or assemble chip package 500.

Referring to FIG. 3, as noted previously in some embodiments optional heat-spreading material 326 (and, more generally, an intermediate material between semiconductor dies 310 that has a high thermal conductivity) may help remove heat generated during operation of circuits on one or more semiconductor dies 310 and/or ramp component 512 (FIGS. 5 and 6). This thermal management may include any of the following thermal paths: a first thermal path in a plane of semiconductor dies 310; a second thermal path in a plane of adhesive layers 322; and/or a third thermal path in a plane of optional heat-spreading material 326. In particular, the thermal flux associated with these thermal paths may be managed independently of each other via thermal coupling at an edge of the chip package. Note that this thermal management may include the use of: phase change cooling, immersion cooling, and/or a cold plate. Also note that the thermal flux associated with the first thermal path that diffuses through the cross-sectional area at the edge of the chip package is a function of nominal thickness 320. Thus, the thermal management may be different in chip packages with larger or smaller nominal thicknesses of semiconductor dies 310.

Note that there may be optional encapsulation around at least a portion of chip package 500 (FIGS. 5 and 6). Additionally, air gaps between components in chip package 500 (FIGS. 5 and 6) may be underfilled to improve heat removal. This may be facilitated by decreasing angle 516 in FIG. 5, i.e., semiconductor dies 310 may be tipped more toward vertical direction 116.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An assembly component, comprising: a pair of separate stepped terraces, horizontally separated from each other, having a vertical stack of steps in which a given step is offset from an adjacent step in a plane of the steps to define the pair of stepped terraces, wherein the steps in the pair of stepped terraces are configured to provide vertical reference positions that constrain vertical positions of an assembly tool during assembly of a ramp-stack chip package, wherein the assembly tool is mechanically coupled to a top surface of a given semiconductor die of a set of semiconductor dies in the ramp-stack chip package, and wherein a vertical position of the top surface of the given semiconductor die that references to the assembly component is constrained by the assembly tool.

2. The assembly component of claim 1, wherein the set of semiconductor dies includes N semiconductor dies; and
wherein position errors of the set of semiconductor dies in the ramp-stack chip package in a vertical direction along the vertical stack are independent of a vertical position in the ramp-stack chip package, and wherein individual position errors of the set of semiconductor dies are prevented from being compounded.

3. The assembly component of claim 2, wherein N is greater than 40.

4. The assembly component of claim 2, wherein the position errors are each less than ±20 μm.

5. The assembly component of claim 1, wherein the assembly component facilitates assembly of the ramp-stack chip package with an accumulated position error over the set of semiconductor dies in a vertical direction along the vertical stack that is less than a sum of position errors associated with the set of semiconductor dies and adhesive layers between the semiconductor dies.

6. The assembly component of claim 5, wherein the accumulated position error is associated with one of: thickness variation of the semiconductor dies, and thickness variation of the adhesive layers.

7. The assembly component of claim 1, wherein the given semiconductor die includes solder pads and bumps on the top surface; and
wherein the assembly tool picks up the given semiconductor die in a region of the top surface other than where the solder pads and the bumps are located.

8. The assembly component of claim 1, wherein the set of semiconductor dies in the ramp-stack chip package are arranged in a vertical stack in which a given semiconductor die is offset from an adjacent semiconductor die in a plane of the set of semiconductor dies to define a stepped terrace, and wherein the stepped terrace is a minor image of the pair of stepped terraces.

9. The assembly component of claim 1, wherein the given semiconductor die has a nominal thickness; and
wherein a vertical displacement of the given step in the stepped terrace is larger than the nominal thickness.

10. The assembly component of claim 1, wherein the assembly component facilitates rigid mechanical coupling of a ramp component to the ramp-stack chip package,
wherein the ramp component is positioned on one side of the vertical stack, and
wherein the ramp component is approximately parallel to a direction along the stepped terrace, which is between a horizontal direction in the plane of the set of semiconductor dies and a vertical direction along the vertical stack.

11. The assembly component of claim 1, wherein the separate stepped terraces are horizontally separated from each other by a gap, and wherein the assembly tool sits in the gap between the stepped terraces by resting on a step on each of the stepped terraces.

12. A method for assembling a ramp-stack chip package, wherein the method comprises:
applying an adhesive to a top surface of a semiconductor die in the ramp-stack chip package in which a set of semiconductor dies is arranged in a vertical stack, wherein a given semiconductor die in the vertical stack is offset from an adjacent semiconductor die in a plane of the set of semiconductor dies to define a stepped terrace; using an assembly tool, picking up a second semiconductor die on a top surface of the second semiconductor die; and placing a bottom surface of the second semiconductor die on the adhesive on the top surface of the semiconductor die while the vertical position of the assembly tool is constrained by a given step in an assembly component having a pair of separate stepped terraces that are horizontally separated from each other and are arranged on either side of the ramp-stack chip package, wherein steps in the pair of stepped terraces provide vertical reference positions for the assembly tool, wherein the assembly tool is mechanically coupled to the top surface of the second semiconductor die, and wherein a vertical position of the top surface of the second semiconductor die that references to the assembly component is constrained by the assembly tool.

13. The method of claim 12, wherein the applying, picking and placing operations are repeated for additional semiconductor dies in the set of semiconductor dies to assemble the ramp-stack chip package; and wherein vertical positions of the assembly tool are constrained by the steps in the pair of stepped terraces when the ramp-stack chip package is assembled.

14. The method of claim 13, wherein the set of semiconductor dies includes N semiconductor dies; and wherein position errors of the set of semiconductor dies in the ramp-stack chip package in a vertical direction along the vertical stack are independent of a position in the ramp-stack chip package.

15. The method of claim 12, wherein the assembly component facilitates assembly of the ramp-stack chip package with an accumulated position error over the set of semiconductor dies in a vertical direction along the vertical stack that is less than a sum of position errors associated with the set of semiconductor dies and adhesive layers between the semiconductor dies.

16. The method of claim 12, wherein the semiconductor die includes solder pads and bumps on the top surface; and wherein the assembly tool picks up the second semiconductor die in a region of the top surface other than where the solder pads and the bumps are located.

17. The method of claim 12, wherein the stepped terrace is a minor image of the pair of stepped terraces.

18. The method of claim 12, wherein the given semiconductor die has a nominal thickness; and wherein a vertical displacement of the given step in the stepped terrace is larger than the nominal thickness.

19. The method of claim 12, wherein the assembly component facilitates rigid mechanical coupling of a ramp component to the ramp-stack chip package, wherein the ramp component is positioned on one side of the vertical stack, and wherein the ramp component is approximately parallel to a direction along the stepped terrace, which is between a horizontal direction in the plane of the set of semiconductor dies and a vertical direction along the vertical stack.

20. A method for assembling a ramp-stack package comprising a set of semiconductor dies, comprising:

for each die of the semiconductor dies:
  using an assembly tool, picking up the die on a top surface of the die;
  moving the assembly tool up and back along a next step in a set of co-planar steps in a pair of stepped terraces, wherein the next step is offset in a horizontal direction from a previous step in the set of co-planar steps, and wherein each of the stepped terraces is a separate structure from the other of the stepped terraces; and
  placing a bottom surface of the die on adhesive on a top surface of a previous die in the set of semiconductor dies, wherein the previous die is placed in the ramp-stack package by the assembly tool picking up the previous die and moving up and back along the previous step, wherein the set of semiconductor dies is arranged in a vertical stack, and wherein a given semiconductor die in the vertical stack is offset from an adjacent semiconductor die in a plane of the set of semiconductor dies to define the stepped terraces.

* * * * *

UNITED STATES PATENT AND TRADEMARK OFFICE
CERTIFICATE OF CORRECTION

PATENT NO. : 9,209,165 B2  
APPLICATION NO. : 14/059302  
DATED : December 8, 2015  
INVENTOR(S) : Dayringer et al.

Page 1 of 1

It is certified that error appears in the above-identified patent and that said Letters Patent is hereby corrected as shown below:

In the drawings,

On sheet 7 of 7, in FIG. 7, under Reference Numeral 712, line 1, delete "SURAFCE" and insert -- SURFACE --, therefor.

In the claims,

In column 12, line 42, in claim 8, delete "minor" and insert -- mirror --, therefor.

In column 14, line 5, in claim 17, delete "minor" and insert -- mirror --, therefor.

Signed and Sealed this  
Twenty-third Day of August, 2016

Michelle K. Lee  
*Director of the United States Patent and Trademark Office*